(12) United States Patent
Minamio et al.

(10) Patent No.: US 7,268,016 B2
(45) Date of Patent: Sep. 11, 2007

(54) METHOD FOR MANUFACTURING SOLID-STATE IMAGING DEVICES

(75) Inventors: Masanori Minamio, Takatsuki (JP); Hikari Sano, Kakogawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 271 days.

(21) Appl. No.: 10/901,850

(22) Filed: Jul. 28, 2004

(65) Prior Publication Data

US 2005/0037538 A1  Feb. 17, 2005

(30) Foreign Application Priority Data

Aug. 14, 2003 (JP) ............................ 2003-293545

(51) Int. Cl.
*H01L 21/44* (2006.01)
(52) U.S. Cl. ....................... 438/110; 257/433
(58) Field of Classification Search ........ 438/123–125, 438/110–113, 106; 257/433, 666, 676, 678, 257/692, 693, 704, 708, 729, 730, 734; 250/239; 348/373, 374

See application file for complete search history.

(56) References Cited

U.S. PATENT DOCUMENTS

| 6,384,472 B1 | 5/2002 | Huang |
| 6,509,636 B1 | 1/2003 | Tsai et al. |
| 6,545,332 B2 * | 4/2003 | Huang ........................ 257/433 |

2002/0047190 A1  4/2002  Miyamoto

FOREIGN PATENT DOCUMENTS

| JP | 2001-77277 | 3/2001 |
| JP | 2002-373950 | 12/2002 |

* cited by examiner

*Primary Examiner*—David Vu
(74) *Attorney, Agent, or Firm*—Hamre, Schumann, Mueller & Larson, P.C.

(57) ABSTRACT

A housing including a base and rectangular frame-shaped ribs is resin molded in one piece with a plurality of metal lead pieces, forming internal terminal portions and external terminal portions with the metal lead pieces, an imaging element is fixed onto the base inside an internal space of the housing, electrodes of the imaging element are connected respectively to the inner terminal portions of the metal lead pieces, and a transparent plate is joined to an upper face of the ribs. In order to position the transparent plate, a stepped portion is formed on the top face of the ribs by providing a lower step that is lowered along an internal periphery. The transparent plate has a size capable of being mounted onto an upper surface of the lower step within a region inward of an inner wall formed by the stepped portion of the ribs. When fixing the transparent plate to the upper face of the ribs, an adhesive is provided on the upper face of the lower step, the transparent plate is placed on the adhesive to be fixed to the upper surface of the lower step while regulating its position with the inner wall of the stepped portion, and then the portion positioned outside the stepped portion of the ribs is removed. It is easy to position the transparent plate on the upper face of the rib.

6 Claims, 7 Drawing Sheets

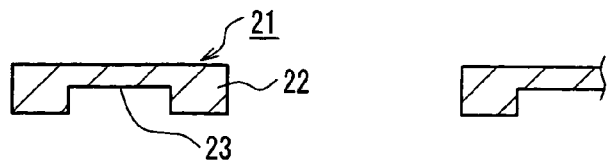
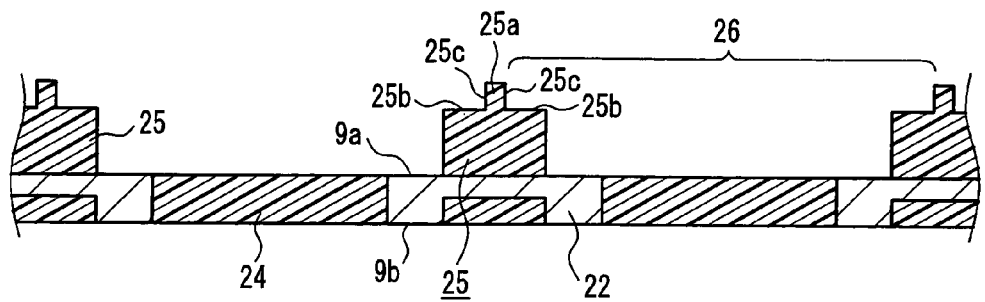
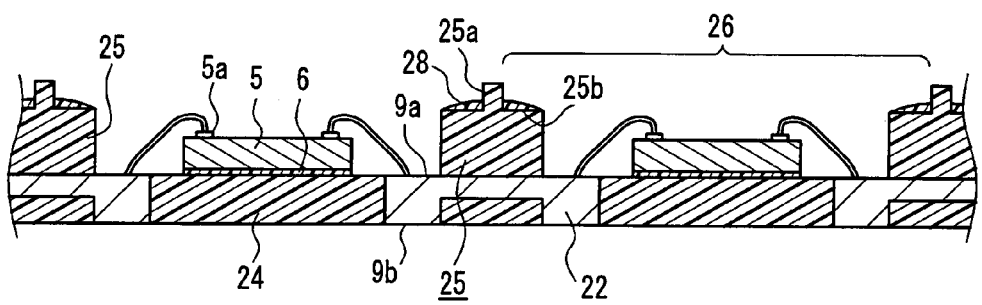
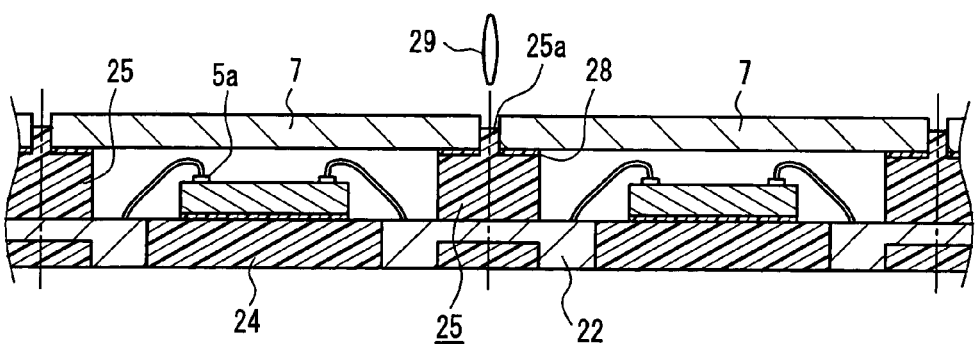
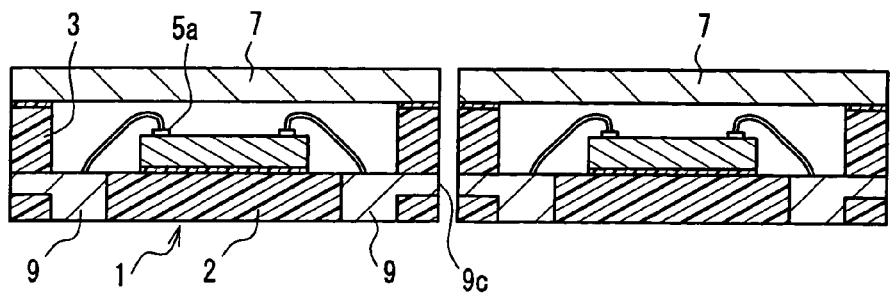

METHOD FOR MANUFACTURING SOLID-STATE IMAGING DEVICES

FIELD OF THE INVENTION

The present invention relates to methods for manufacturing solid-state imaging devices in which an imaging element, such as a CCD or the like, is mounted inside a housing.

BACKGROUND OF THE INVENTION

Solid-state imaging devices, which are widely used for video cameras and still cameras or the like, are provided in form of a package, in which an imaging element, such as a CCD or the like, is mounted on a base made of an insulating material, with the photo-detecting region being covered by a transparent plate. In order to make the device more compact, the imaging element is mounted on the base as a bare chip. FIG. 9 shows the solid-state imaging device disclosed in JP 2001-77277A, which is a conventional example of such a solid-state imaging device.

In FIG. 9, numeral 41 denotes a housing, which is made of a base 41a and frame-shaped ribs 41b formed in one piece by resin molding, thus forming an internal space 42. A die pad 43 positioned at the center of the base 41a and leads 44 positioned below the ribs 41b are embedded in the housing 41. An imaging element chip 45 disposed at the center of the internal space 42 is fixed to the upper side of the die pad 43. The leads 44 include inner terminal portions 44a that are exposed to the internal space 42 at the upper side of the base 41a on the inner side of the ribs 41b and outer terminal portions 44b that are accessible from the bottom side of the base 41a below the ribs 41b. The inner terminal portions 44a and the bonding pads of the imaging element chip 45 are connected by bonding wires 46 made of metal. A transparent sealing glass plate 47 is fixed to the upper surface of the ribs 41b, thus forming a package for protection of the imaging element chip 45.

This solid-state imaging device is mounted on a circuit board with the sealing glass plate 47 facing upward, as shown in FIG. 9, and the outer terminal portions 44b are used to connect it to the electrodes on the circuit board. Although not shown in the drawings, a lens barrel incorporating an imaging optical system whose relative position to the photo-detecting region formed in the imaging element chip 45 is adjusted with a predetermined precision, is mounted on top of the sealing glass plate 47. During the imaging operation, object light that has passed through the imaging optical system incorporated in the lens barrel is focused on the photo-detecting region and photoelectrically converted.

A solid-state imaging device with such a configuration is connected by the outer terminal portions 44b exposed at the bottom surface of the housing to electrodes on the circuit board, so that the height and the occupied surface area of the package are smaller than in configurations using a connection with outer leads bent downward from the sides of the housing, thus making it suitable for high-density packaging.

In the technology disclosed in JP 2001-77277A, an upper mold 48 and a lower mold 49 as shown in FIG. 10 are used to resin mold the housing 41 of the shape shown in FIG. 9. The upper side of the lower mold 49 is flat. The lower side of the upper mold 48 is provided with recessed portions 48a corresponding to the ribs 41b. An inner protruding portion 48b forming the internal space 42 and outer protruding portions 48c forming the outer surface of the ribs 41b are provided at both sides of the recessed portions 48a. The leads 44 and the die pad 43 are supplied in integrated form as a lead frame 50, and are disposed between the upper mold 48 and the lower mold 49.

By interposing the lead frame 50 between the upper mold 48 and the lower mold 49, a cavity 51 for molding the base 41a is formed between the lower mold 49 and the inner protruding portion 48b of the upper mold 48. In this state, a resin is filled in, and when the die opened and the molded product retrieved, the base 41a and the ribs 41b forming the housing 41 have their finished form. That is to say, as shown in FIG. 10, the recessed portions 48a of the upper mold 48 correspond exactly to the shape of the ribs 41b, and there is no additional finishing after molding. After the molding, the lead frame 50 is cut at locations positioned at the outer side of the ribs 41b.

When fixing the seal glass plate 47 to the upper face of the ribs 41b in the above-described solid-state imaging device manufacturing process, an adhesive is applied on the upper face of the ribs 41b, as shown in FIG. 9, and then the seal glass plate 47 is positioned on the upper face of the ribs 41b and mounted. However, because the upper face of the ribs 41b is flat as shown in FIG. 9, and the ribs 41b are approximately 1 mm wide, the positioning of the seal glass plate 47 with respect to the flat upper face is difficult, and this is one cause of a drop in manufacturing efficiency.

In order to provide a wider margin of tolerance for positioning the seal glass plate 47, it is necessary that the upper surface of the ribs 41a has at least a certain width. Ensuring a sufficient width for the ribs 41b is an impediment to miniaturizing the area of the housing 41.

SUMMARY OF THE INVENTION

It is an object of the present invention to provide a method for manufacturing solid-state imaging devices in which it is easy to position the seal glass plate with respect to the upper face of the ribs, and moreover in which after finishing, the rib width is small and miniaturization of the housing is possible.

A method for manufacturing a solid-state imaging device according to the present invention, includes: resin-molding a housing including a base and rectangular frame-shaped ribs in one piece with a plurality of metal lead pieces, forming internal terminal portions and external terminal portions with the metal lead pieces; fixing an imaging element onto the base inside an internal space of the housing; connecting electrodes of the imaging element respectively to the inner terminal portions of the metal lead pieces; and fixing a transparent plate to an upper face of the ribs.

To solve the above-mentioned problem, a stepped portion is formed on the top face of the ribs, providing a lower step that is lowered along an internal periphery, the transparent plate has a size capable of being mounted onto an upper surface of the lower step within a region inward of an inner wall formed by the stepped portion of the ribs, and when fixing the transparent plate to the upper face of the ribs, an adhesive is provided on the upper face of the lower step, the transparent plate is placed on the adhesive to be fixed to the upper surface of the lower step while regulating its position with the inner wall of the stepped portion, and then the portion positioned outside the stepped portion of the ribs is removed.

BRIEF DESCRIPTION OF THE DRAWINGS

FIGS. 5A to 5E are cross-sectional views illustrating a method for manufacturing a solid-state imaging device according to Embodiment 2 of the present invention.

DESCRIPTION OF THE PREFERRED EMBODIMENTS

Figure 1:
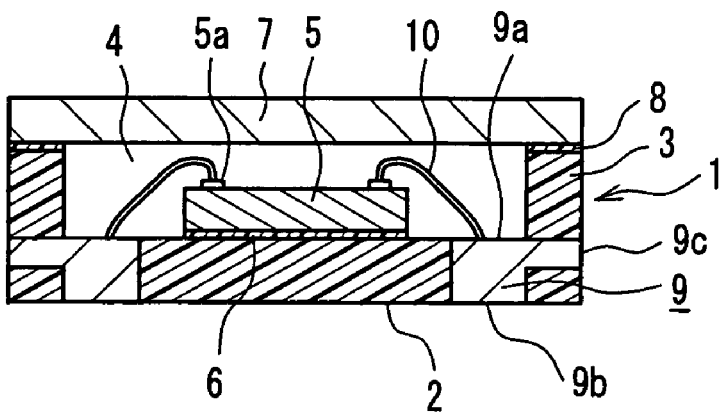
FIG. 1 is a cross-sectional view showing a configuration of a solid-state imaging device in accordance with Embodiment 1 of the present invention.

With the method for manufacturing solid-state imaging devices according to the present invention, when placing the transparent plate on an upper face of the ribs, the position of the transparent plate is regulated by an inner peripheral end face formed by a stepped portion of the rib upper face. Consequently, positioning the transparent plate is easy and reliable even if the width of the upper face of the ribs is made small, and the width of the ribs is no impediment to making the housing more compact. Moreover, as the external side portion of this stepped portion is ultimately removed, formation of the stepped portion for the purpose of position regulation is also no obstacle to making the housing more compact.

When the method for manufacturing solid-state imaging devices according to the present invention is applied to manufacturing a plurality of solid-state imaging devices, it is advantageous if it is carried out as follows:

A plurality of the housings are molded together with a plurality of the metal lead pieces being arranged respectively, so that rib forming members are formed with the ribs forming adjacent housings combined into one, and a protruding portion is provided on the upper face of the rib forming members in the center in width direction so as to extend in a longitudinal direction, forming the stepped portion. After the imaging element is fixed inside the internal space of each housing, the electrodes of the imaging element are connected to the internal terminal portions with connecting members. Then, after an adhesive is provided on a top face of the lower step formed on both sides of a protruding portion of the rib forming member, transparent plates are placed and joined on the adhesive on the upper face of the lower step while regulating the position of the transparent plates by side walls of the protruding portion of the rib forming members of the housings. And then, the solid-state imaging devices are separated into pieces so as to eliminate the protruding portion, by cutting each housing in a direction that is perpendicular to the base and divides the width of the rib forming members into two.

Referring to the drawings, the following is a more specific description of a method for manufacturing solid-state imaging devices according to an embodiment of the present invention.

Figure 2:
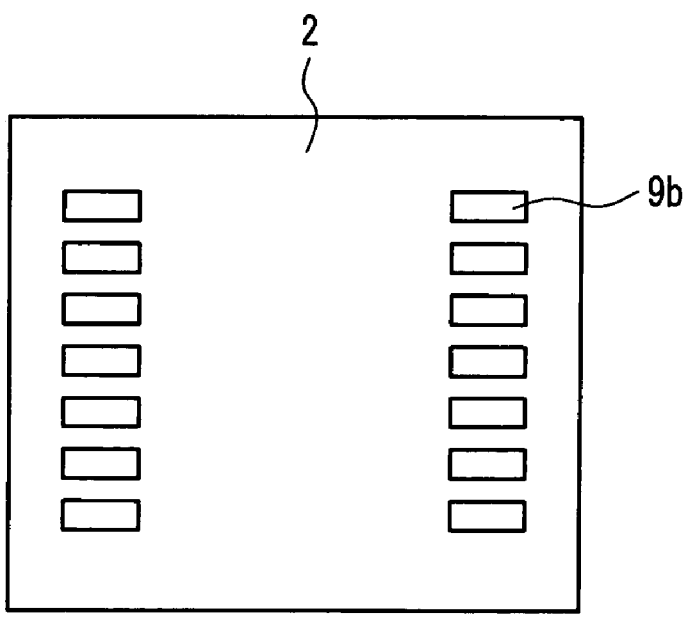
FIG. 2 is a bottom view of the solid-state imaging device of FIG. 1.
Figure 3:
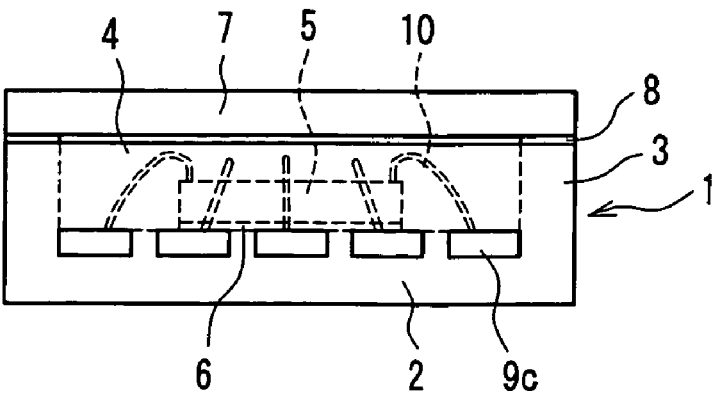
FIG. 3 is a lateral view of the solid-state imaging device of FIG. 1.
Figure 4:
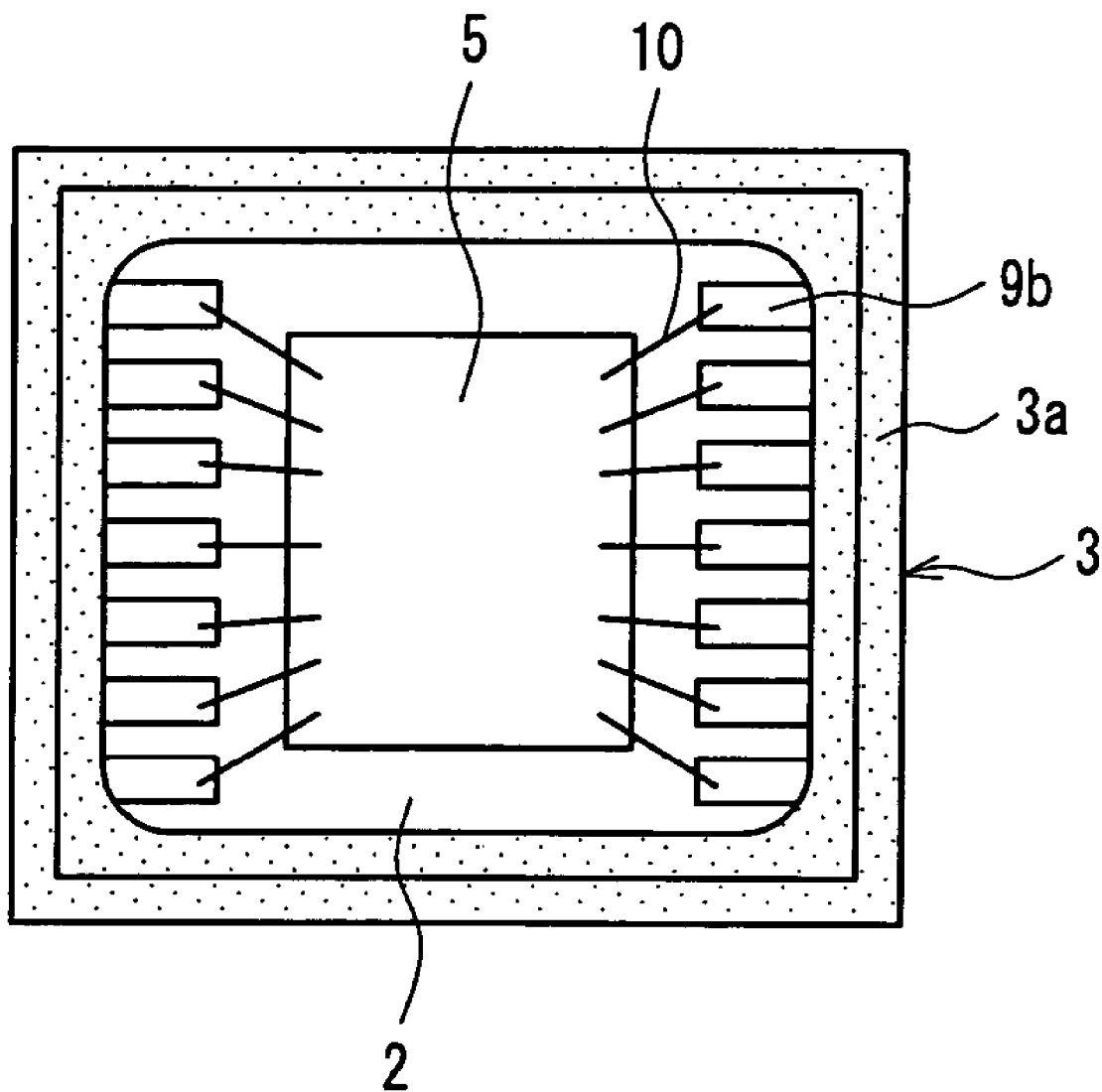
FIG. 4 is a plan view of the solid-state imaging device in FIG. 1 without the transparent plate.

FIGS. 1 to 4 show the structure of a solid-state imaging device made by this manufacturing method. FIG. 1 is a cross-sectional view, FIG. 2 is a bottom view and FIG. 3 is a lateral view of the solid-state imaging device. FIG. 4 is a plan view showing the solid-state imaging device with a portion of its elements removed.

Numeral 1 denotes a housing made of a thermosetting resin or a thermoplastic resin, such as epoxy resin, having ribs 3 arranged as a rectangular frame on a planar base 2 and fabricated by molding in one piece. An imaging element 5 is fixed by a fixing member 6 such as an adhesive onto the base 2 which faces an internal space 4 of the housing 1. A transparent plate 7 made of, for example, glass is fixed on the upper face of the ribs 3 by an adhesive 8, sealing the internal space 4 of the housing 1 and forming the package. The height of the ribs 3 is in a range of 0.1 to 1.0 mm for example, and the width of the ribs is set to 0.1 to 1.0 mm for example.

A plurality of metal lead pieces 9 are embedded in the housing 1 at the time of molding. The metal lead pieces 9 are components for electrically leading from the internal space 4 of the housing 1 to the exterior and include an inner terminal portion 9a exposed on the surface of the internal space side of the base 2, an outer terminal portion 9b exposed on a rear surface of the base 2 at a position corresponding to the inner terminal portion 9a, and a lateral electrode portion 9c exposed on the lateral face of the housing 1. Electrode pads 5a of the imaging element 5 and the inner terminal portion 9a of the metal lead pieces 9 are connected by thin metal wires 10. The thickness of the entire package is set to no more than 2.0 mm, for example. FIG. 4 is a plan view of the solid-state imaging device in FIG. 1 without the transparent plate 7.

As shown in FIG. 1, on the metal lead pieces 9, the rear face corresponding to the position of the inner terminal portion 9a forms the outer terminal portion 9b. Furthermore, the metal lead pieces 9 in those portions are of substantially identical thickness as the base 2. Consequently, when resin forming it is possible to clamp the metal lead pieces 9 at the inner terminal portion 9a and the outer terminal portion 9b with the upper and lower molds. Thus, the surface of the inner terminal portions 9a is pressed down by the surface of the upper mold and is in close contact therewith, so that the generation of resin burr can be suppressed. The lateral electrode portions 9c located below the ribs 3 in the metal lead pieces 9 are formed to be thin by half-etching, and their bottom surface is covered by the resin.

As shown in FIG. 1 and FIG. 3, the external peripheral face of the housing 1, in other words, the external lateral face of the rib 3, forms a plane that is substantially perpendicular with respect to the face of the base 2. Further, the end face of the transparent plate 7 and the surface of the lateral electrode portion 9c are formed substantially flush with the external lateral faces of the housing 1. The internal peripheral face of the housing 1, in other words the internal lateral face of the rib 3, may be formed with a taper (not shown in drawings) which opens out from the surface of the base 2 in the direction of the transparent plate 7, for the purpose of allowing easy mold release after resin forming.

Figure 6:
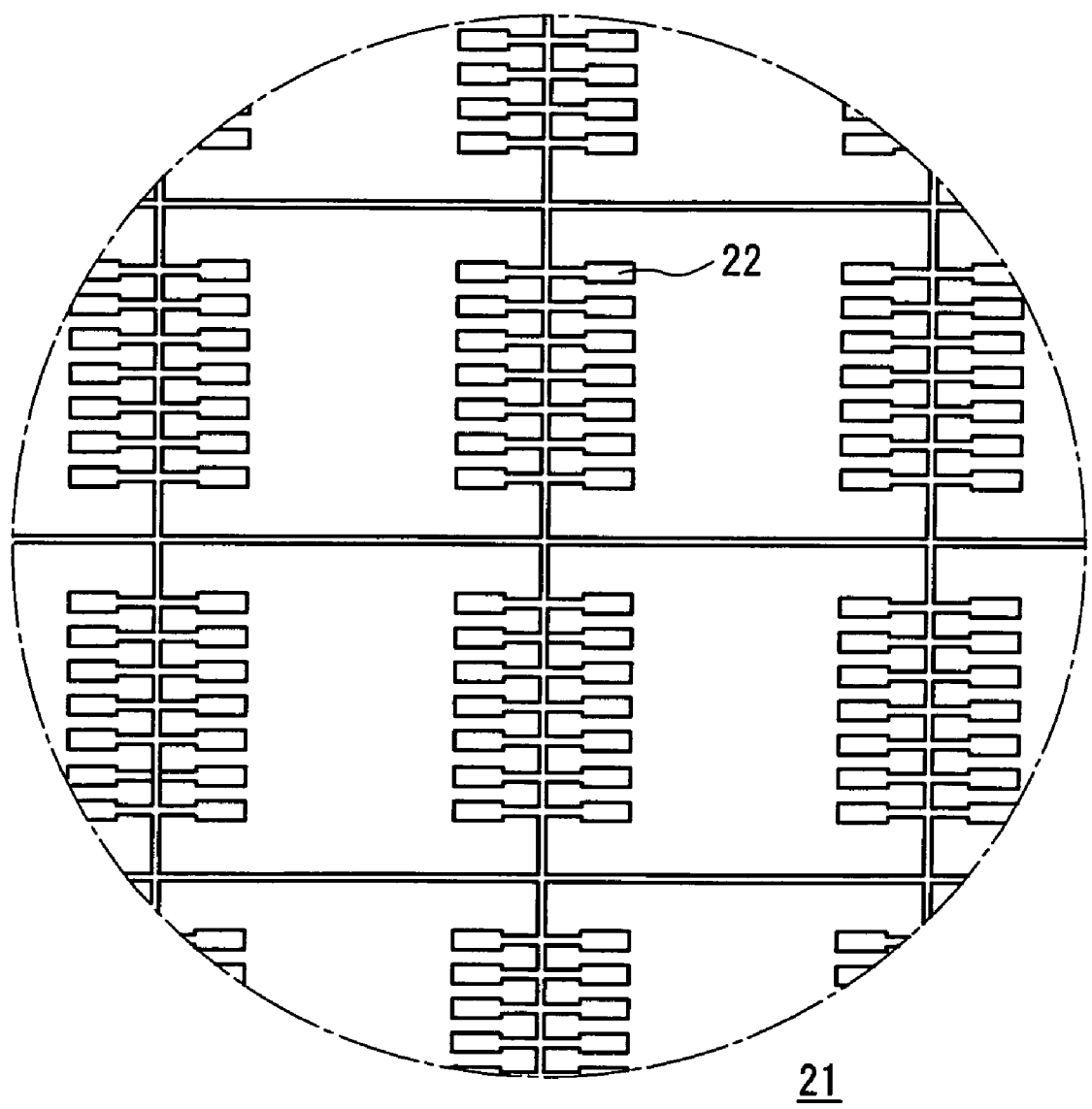
FIG. 6 is a plan view of a lead frame in this manufacturing method.
Figure 7:
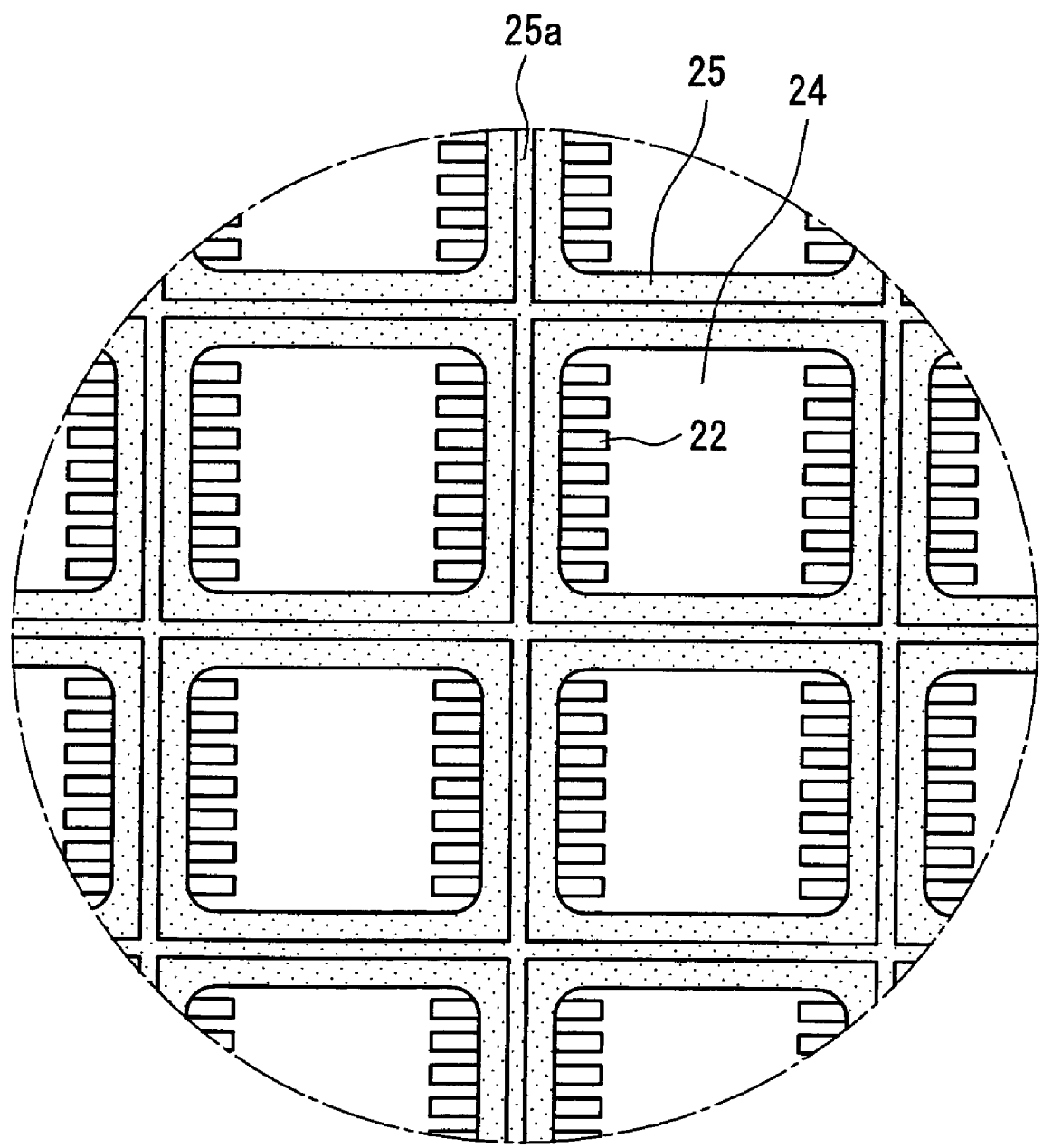
FIG. 7 is a plan view of the molded resin product in which the lead frame is embeded in this manufacturing method.

The method for manufacturing a solid-state imaging device according to the present embodiment makes possible the efficient and highly accurate manufacturing of solid-state imaging devices having the above-described structure and performed by the steps explained below with reference to FIGS. 5 to 7.

First, as shown in FIG. 5A, a lead frame 21 is prepared. As shown in the plan view of FIG. 6, the lead frame 21 links a plurality of lead portions 22 in order to form the metal lead pieces 9 shown in FIG. 1. The thickness in the position corresponding to the internal terminal portion 9a of the lead portions 22 is set substantially identical to the thickness of the base 2. The lead portions 22 have a recessed portion 23 formed by half etching their lower surface, and by cutting this portion in a later process, this becomes the shape of the metal lead pieces 9 shown in FIG. 1.

Next, as shown in FIG. 5B, the lead frame 21 is embedded by insert molding with a resin so as to fabricate a molded article that includes a plurality of housings 26 made of a base 24 and a rib forming member 25. FIG. 7 shows the plan view after molding. The upper and lower faces of the lead portion 22 are embedded so as to be exposed from the upper and lower face of each base 24, and form the inner terminal portion 9a and the outer terminal portion 9b. The rib forming member 25 has a shape obtained by combining the ribs of adjacent housings 26 into one. A protruding portion 25a is formed on the central portion of the upper face of the rib forming members 25 such that it extends in the longitudinal direction of the rib forming members 25 (see FIG. 7). Consequently, a stepped portion 25c is formed by the side walls on both sides of the protruding portion 25a, and thereby, in the inner portion of each housing 26, the upper face of the rib forming members 25 forms a lower step 25b.

Next, as shown in FIG. 5C, the imaging element 5 is fixed by the adhesive 6 in the internal space which is enclosed by the rib forming member 25, and the pad electrodes 5a of the imaging element 5 are connected to the internal terminal portions 9a by the thin metal wires 10. Next, an adhesive 28 is coated onto the upper face of the lower step 25b on both sides of the protruding portion 25a.

Next, as shown in FIG. 5D, the transparent plates 7 are put in place and fixed. The transparent plates 7 have dimensions and shape corresponding to the housings 26. More specifically, the peripheral end face of the transparent plates 7 is positioned by the inner side of the side wall of the protruding portion 25a, that is to say, the stepped portion 25c, and consequently is of a size facing the upper face of the lower step 25b. Thus, when mounting the transparent plates 7, their position is regulated by the stepped portion 25c, so that the transparent plates 7 easily can be positioned on the top face of the rib forming members 25.

After the transparent plates 7 have been fixed with the adhesive 28, the rib forming members 25, the lead portion 22 and the base 24 are cut with a dicing blade 29, and separated into pieces forming individual solid-state imaging devices as shown in FIG. 5E. As shown in FIG. 5D, the cutting is performed in a direction perpendicular to the base 24, such that the width of the ribs 25 is halved, when viewed from above. At this time, the cutting is performed such that the region of the protruding portion 25a of the rib forming members 25 is eliminated. As a result, the housing 1 made of the base 2 and the ribs 3, and the metal lead pieces 9, are formed by the divided rib forming members 25, the lead portion 22 and the base 24. Furthermore, the lateral electrode portions 9c of the metal lead pieces 9 are exposed.

According to the method for manufacturing in the present embodiment, when mounting the transparent plates 7 onto the upper face of the rib forming members 25, the position of the transparent plates 7 can be regulated by the inner peripheral end face of the stepped portion 25c forming the protruding portion 25a. Thus, even if the width of the upper face of the rib forming members 25 is made small, positioning the transparent plate 7 is easy and reliable, and the width of the rib forming member 25 is no impediment to miniaturization of the housing. Moreover, as the protruding portion 25a of the stepped portion is ultimately eliminated, the shape of the protruding portion 25a for the purpose of regulating position is also no impediment with respect to the miniaturization of the housing.

It should be noted that it is possible to set the width of the rib forming member 25, which is formed by combining the two ribs of adjacent housings 26 into one, to less than twice the width of an individually molded rib according to the conventional method. Consequently, if this is cut in half as shown in FIG. 5E, the width of the ribs 3 of the solid-state imaging devices is smaller than when each of the ribs is formed individually, and the surface area of the solid-state imaging device can be reduced accordingly.

Even in such dimension, it is possible to ensure a width of the ribs 25 in a range that is sufficient for applying the adhesive for adhering the transparent plate 7. In the most extreme case, if the ribs 25 are formed with the same width as the individually formed ribs and then cut in two pieces, then the width of the ribs 3 after the cutting can be made of half that in the conventional example.

Moreover, when cutting the ribs 25 in two pieces in the width direction, the cutting plane is perpendicular to the substrate portion 24. By contrast, if the ribs are formed individually as in the conventional art, then a taper for breaking the molded article from the mold after molding has to be provided on the outer lateral surface of the ribs. Consequently, the surface area of ribs that are fabricated in accordance with the present invention is reduced by the amount saved by not providing that outer taper portion.

Furthermore, since the rib forming member 25 and the lead portions 22 are cut together with the same dicing blade 29, the lateral surface of the package, which is formed by the end face of the transparent cover 7, the lateral surface of the casing 1, and the end surface of the metal lead strips 9, are substantially flush, and a favorable degree of flatness can be attained. Consequently, when mounting the device in the lens barrel accommodating the optical system, positioning of the optical system with respect to the photo-detecting portion of the imaging element 5 can be performed with high precision utilizing the lateral face of the package. That is to say, the device easily can be positioned with regard to the horizontal position by abutting the lateral surface of the package against the inner surface of the lens barrel. It should be noted that the positioning in the vertical direction can be performed by abutting the lower surface of the lens barrel against the circuit board surface.

Referring to FIG. 8, the following is a more specific explanation of the process step for molding the casing with a resin, as shown in FIG. 5B of the above-described manufacturing process.

Figure 8A:
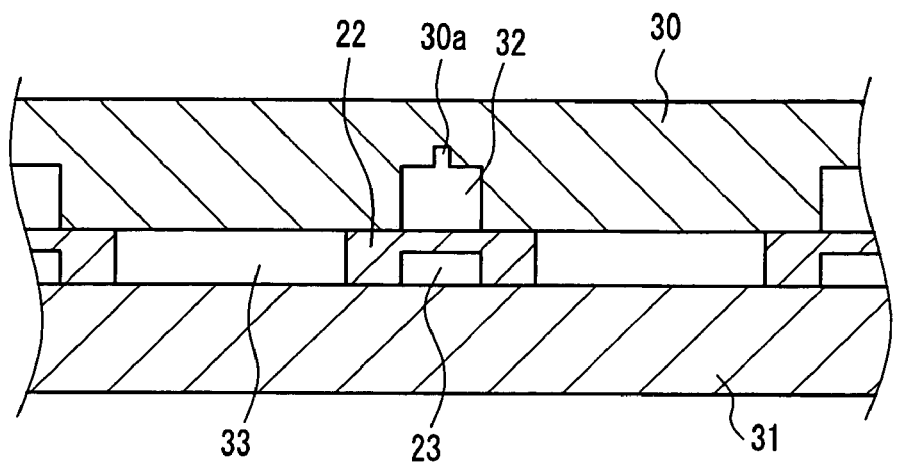
FIGS. 8A to 8C are cross-sectional views showing the resin molding step of this manufacturing method in more detail.

First, as shown in FIG. 8A, a lead frame is interposed between the upper mold 30 and the lower mold 31, and the upper and lower surfaces of the lead portions 22 are clamped by the upper mold 30 and the lower mold 31. The upper surface of the lower mold 31 is flat, but the lower surface of the upper mold 30 is provide with a recessed portion 32 for the purpose of forming the rib forming members 25 (see FIG. 5B). At the center of the recessed portion 32, a groove 30a is provided for the purpose of forming the protruding portion 25a of the rib forming members 25. By interposing the lead portions 22, a space 33 formed between the upper mold 30 and the lower mold 31, a space of the recessed portion 32 of the upper mold 30, and a space of the recessed portion 23 of the lead portions 22 form the cavities for the resin molding.

Figure 8B:
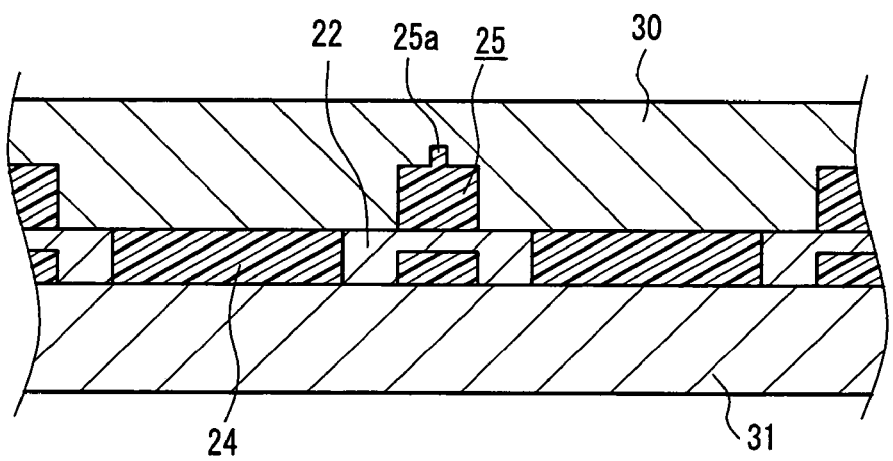
Figure 8C:
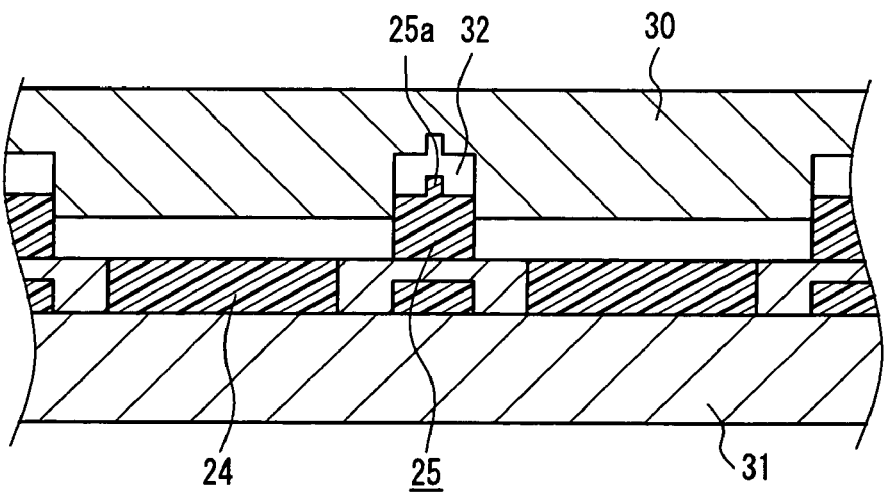
Figure 9:
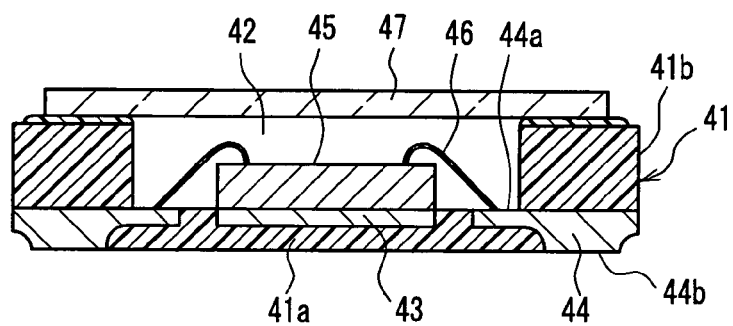
FIG. 9 is a cross-sectional view of a conventional solid-state imaging device.
Figure 10:
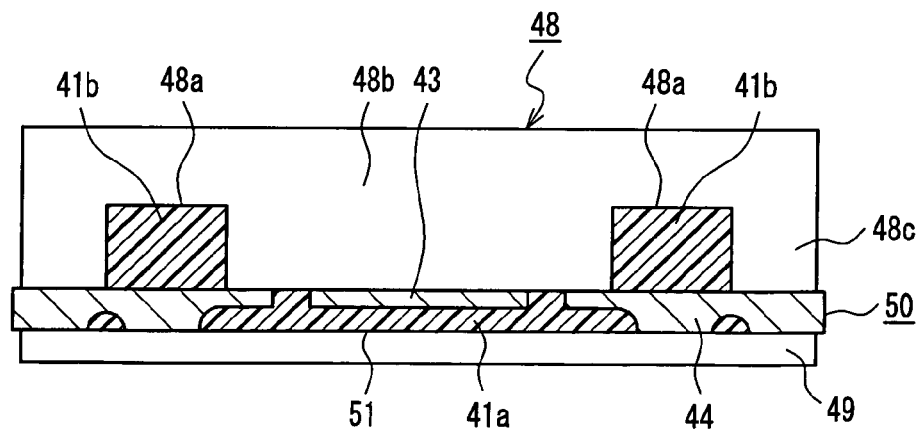
FIG. 10 is a cross-sectional view showing the step of molding the housing of this solid-state imaging device.

Next, as shown in FIG. 8B, a resin is filled into the cavity, and the base 24 and the rib forming member 25 are molded. After that, the dies are opened as shown in FIG. 8C, and a molded product of linked housings as shown in FIG. 5B is retrieved.

In this molding step, the upper and lower surfaces of the lead portions 22 are clamped by the upper mold 30 and the lower mold 31, ensuring that the die surfaces and the upper and lower surfaces of the lead portions 22 are consistently in close contact. Moreover, the border between the upper mold 30 and the recessed portion 32 is located above the lead portions 22. As a result, the creation of resin burr caused by the molding can be suppressed effectively.

Moreover, if a resin sheet for the prevention of resin flash burr can be interposed between the dies and the lead frame 21 when resin molding the housing, then the creation of burr can be suppressed even more effectively.

In the explanation given above, an example is given whereby the ribs forming adjacent housings are combined into one, however, as shown in the conventional example, it is possible to achieve a similar effect as through the application of the manufacturing method according to the present embodiment even when a method is employed wherein adjacent ribs are formed separately.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a solid-state imaging device, comprising:
   resin-molding a housing comprising a base and frame-shaped ribs in one piece with a plurality of metal lead pieces, forming internal terminal portions, external terminal portions and lateral terminal portions with the metal lead pieces, and providing a lower step that is lowered along an internal periphery so as to form a stepped portion on a top face of the ribs;
   fixing an imaging element onto the base inside an internal space of the housing;
   connecting electrodes of the imaging element respectively to the inner terminal portions of the metal lead pieces;
   providing an adhesive on an upper face of the lower step;
   placing a transparent plate having a site capable of being mounted onto the upper face of the lower step within a region inward of an inner wall formed by the stepped portion of the ribs on the adhesive to be fixed to the upper face of the lower step while regulating its position with the inner wall of the stepped portion; and
   removing all of the stepped portion of the ribs so that the end face of the transparent plate is flush with the side face of the rib and the lateral terminal portion.

2. The method for manufacturing a solid-state imaging device according to claim 1, wherein
   a lower portion of the metal lead piece is partly removed to form a thin portion and a thick portion, and
   the metal lead piece is resin molded with the thin portion being positioned under the rib, so that the thick portion forms the internal terminal portion with an upper face and forms die external terminal portion with a surface opposite to the internal terminal portion, and a lower surface of the thin portion is covered with the resin.

3. The method for manufacturing a solid-state imaging device according to claim 1, wherein
   a lower portion of the metal lead piece is partly removed to form a thin portion and a thick portion,
   the metal lead piece is resin molded with the thin portion being positioned under the rib, so that the thick portion forms the internal terminal portion with an upper face and forms the external terminal portion with a surface opposite to the internal terminal portion, and a power surface of the thin portion is covered with the resin, and
   a side surface of the metal lead piece is exposed from the resin to form a lateral terminal portion whose lower surface covered with the resin.

4. A method for manufacturing a solid-state imaging device, comprising:
   resin molding a plurality of housings comprising a base and frame-shaped ribs together with a plurality of the metal lead pieces being arranged in the housings respectively, funning internal terminal portions and external terminal portions with the metal lead pieces; so that rib forming members are formed with the ribs forming adjacent housings combined into one, and a protruding portion is provided on an upper face of the rib forming members in the center in the width direction so as to extend in a longitudinal direction;
   fixing an imaging element onto the base inside the internal space of each housing;
   connecting the electrodes of the imaging element to the respective internal terminal portions;
   providing an adhesive on a top face of a lower step formed on both sides of the protruding portion of the rib forming member;
   placing transparent plates having a size capable of being mounted onto the top face of the lower step within a region inward of an inner wall formed by the stepped portion of the ribs on the adhesive to be fixed to the top face of the lower step while regulating the position of the transparent plates by side walls of the protruding portion of the rib forming members of the housings; and
   separating solid-state imaging devices into pieces so as to eliminate the protruding portion, by cutting the rib forming members so that all of the protruding portions are removed and an end face of the transparent plate is flush with the side free of the rib.

5. The method for manufacturing a solid-state imaging device according to claim 4, wherein
   a lower portion of the metal lead piece is partly removed to form a thin portion and a thick portion, and
   the metal lead piece is resin-molded with the thin portion being positioned under the rib forming member, so that the thick portion forms the internal terminal portion with an upper face and forms the external terminal portion with a surface opposite to the internal terminal portion, and a lower surface of the thin portion is covered with the resin.

6. The method for manufacturing a solid-state imaging device according to claim 4, wherein
   a lower portion of the metal lead piece is partly removed to form a thin portion and a thick portion so that the metal lead piece has a recess,
   the metal lead piece is resin molded so that the rib forming member is formed above the recess, the thick portion forms the internal terminal portion with an upper face and forms the external terminal portion with a surface opposite to the internal terminal portion, and the recess is covered with the resin; and in the step of separating solid-state imaging devices into pieces, the thin portion of the metal lead piece which is the recess is cut so that a side surface of the metal Head piece forms a lateral terminal portion whose lower surface covered with the resin.

* * * * *